(12) United States Patent
Hikosaka et al.

(10) Patent No.: US 12,074,203 B2
(45) Date of Patent: Aug. 27, 2024

(54) NITRIDE CRYSTAL, OPTICAL DEVICE, SEMICONDUCTOR DEVICE, AND METHOD FOR MANUFACTURING NITRIDE CRYSTAL

(71) Applicants: KABUSHIKI KAISHA TOSHIBA, Tokyo (JP); OSAKA UNIVERSITY, Suita (JP)

(72) Inventors: Toshiki Hikosaka, Kawasaki (JP); Shinya Nunoue, Ichikawa (JP); Tomoyuki Tanikawa, Suita (JP); Ryuji Katayama, Suita (JP); Masahiro Uemukai, Suita (JP)

(73) Assignees: KABUSHIKI KAISHA TOSHIBA, Tokyo (JP); OSAKA UNIVERSITY, Osaka (JP)

( * ) Notice: Subject to any disclaimer, the term of this patent is extended or adjusted under 35 U.S.C. 154(b) by 0 days.

(21) Appl. No.: 18/295,879

(22) Filed: Apr. 5, 2023

(65) Prior Publication Data
US 2023/0261058 A1     Aug. 17, 2023

Related U.S. Application Data

(62) Division of application No. 17/141,273, filed on Jan. 5, 2021, now Pat. No. 11,677,006.

(30) Foreign Application Priority Data

Feb. 27, 2020   (JP) ................. 2020-032021

(51) Int. Cl.
   *H01L 29/20*      (2006.01)
   *C23C 16/30*      (2006.01)
   (Continued)

(52) U.S. Cl.
   CPC ........ *H01L 29/2003* (2013.01); *C23C 16/303* (2013.01); *G02F 1/3551* (2013.01);
   (Continued)

(58) Field of Classification Search
   CPC ............. C23C 16/303; H01L 21/02389; H01L 21/02458; H01L 21/0254; H01L 29/2003
   See application file for complete search history.

(56) References Cited

U.S. PATENT DOCUMENTS 6,447,604 B1   9/2002 Flynn
7,595,507 B2   9/2009 Francis
       (Continued)

FOREIGN PATENT DOCUMENTS

JP   2003-101149 A   4/2003
JP   2006-135001 A   5/2006
       (Continued)

OTHER PUBLICATIONS

Nagamatsu et al., "Effect of substrate misorientation on the concentration of impurities and surface morphology of an epitaxial GaN layer on N-polar GaN substrate by MOVPE," Journal of Crystal Growth 512 (2019) 78.*

(Continued)

*Primary Examiner* — Jay C Kim
(74) *Attorney, Agent, or Firm* — Oblon, McClelland, Maier & Neustadt, L.L.P.

(57) ABSTRACT

According to one embodiment, a nitride crystal includes first, second, and third nitride crystal regions. The third nitride crystal region includes Al, and is provided between the first and second nitride crystal regions. A third oxygen concentration in the third nitride crystal region is greater than a first oxygen concentration in the first nitride crystal region and greater than a second oxygen concentration in the second nitride crystal region. A third carbon concentration in the third nitride crystal region is greater than a first carbon concentration in the first nitride crystal region and greater than a second carbon concentration in the second nitride crystal region. A <0001> direction of the first nitride crystal region is one of a first orientation from the second nitride (Continued)

crystal region toward the first nitride crystal region or a second orientation from the first nitride crystal region toward the second nitride crystal region.

17 Claims, 10 Drawing Sheets

(51) Int. Cl.
  G02F 1/355 (2006.01)
  G02F 1/37 (2006.01)
  H01L 21/02 (2006.01)

(52) U.S. Cl.
  CPC .......... G02F 1/37 (2013.01); H01L 21/02389 (2013.01); H01L 21/02458 (2013.01); H01L 21/0254 (2013.01)

(56) References Cited

U.S. PATENT DOCUMENTS

| | | | |
|---|---|---|---|
| 8,110,424 | B2 | 2/2012 | Yang et al. |
| 8,669,168 | B1* | 3/2014 | Storm ............... H01L 21/02458 |
| | | | 438/503 |
| 8,809,868 | B2* | 8/2014 | Enya .................... H01L 33/325 |
| | | | 257/E29.089 |
| 8,907,378 | B2 | 12/2014 | Teo et al. |
| 9,876,101 | B2* | 1/2018 | Sato .................. H01L 21/02579 |
| 10,186,588 | B1* | 1/2019 | Kato ..................... H01L 29/778 |
| 10,461,214 | B2 | 10/2019 | Saito |
| 10,865,469 | B2* | 12/2020 | Fujioka ............... H01S 5/18341 |
| 11,437,504 | B2 | 9/2022 | Then |
| 2010/0072485 | A1 | 3/2010 | Suda |
| 2018/0094361 | A1 | 4/2018 | Mori |
| 2018/0182916 | A1 | 6/2018 | Saito |
| 2018/0329236 | A1 | 11/2018 | Hikosaka |
| 2021/0005717 | A1* | 1/2021 | Isono .................. H01L 29/7786 |

FOREIGN PATENT DOCUMENTS

| | | |
|---|---|---|
| JP | 2010-098285 A | 4/2010 |
| JP | 2014-183311 A | 9/2014 |
| JP | 2018-194617 A | 12/2018 |

OTHER PUBLICATIONS

Reshchikov et al., "Determination of the concentration of impurities in GaN from photoluminescence and secondary ion mass spectrometry," Scientific Reports 10 (2020) 2223.*

Ishibashi et al., "Residual Impurities in GaN/Al2O3 Grown by Metalorganic Vapor Phase Epitaxy," Journal of Electronic Materials 25 (1996) pp. 799-803.*

Diez et al., "Record high electron mobility and low sheet resistance on scaled-channel N-polar GaN/ AlN heterostructures grown on on-axis N-polar GaN substrates by plasma-assisted molecular beam epitaxy," Applied Physics Letters 117 (2020) 042102.*

* cited by examiner

NITRIDE CRYSTAL, OPTICAL DEVICE, SEMICONDUCTOR DEVICE, AND METHOD FOR MANUFACTURING NITRIDE CRYSTAL

CROSS-REFERENCE TO RELATED APPLICATIONS

This application is a divisional of and claims benefit under 35 U.S.C. § 120 to U.S. application Ser. No. 17/141,273 filed Jan. 5, 2021, which is based upon and claims the benefit of priority under 35 U.S.C. § 119 from Japanese Patent Application No. 2020-032021, filed Feb. 27, 2020, the entire contents of each of which are incorporated herein by reference.

FIELD

Embodiments of the invention generally relate to a nitride crystal, an optical device, a semiconductor device, and a method for manufacturing a nitride crystal.

BACKGROUND

Nitride crystals are utilized in optical devices, semiconductor devices, etc. It is desirable to improve the characteristics of nitride crystals.

DETAILED DESCRIPTION

Figure 1:
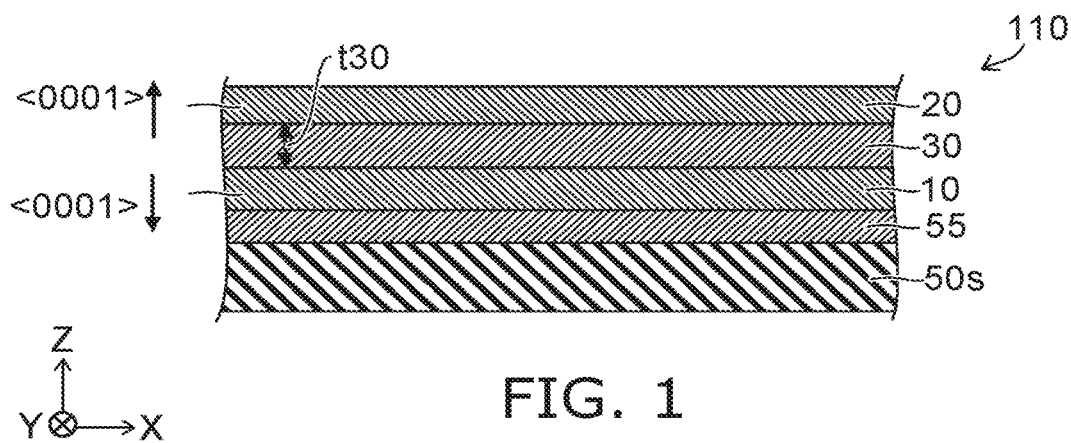
FIG. 1 is a schematic cross-sectional view illustrating a nitride crystal according to a first embodiment.

According to one embodiment, a nitride crystal includes a first nitride crystal region a second nitride crystal region, and a third nitride crystal region. The third nitride crystal region includes Al, and is provided between the first nitride crystal region and the second nitride crystal region. A third oxygen concentration in the third nitride crystal region is greater than a first oxygen concentration in the first nitride crystal region and greater than a second oxygen concentration in the second nitride crystal region. A third carbon concentration in the third nitride crystal region is greater than a first carbon concentration in the first nitride crystal region and greater than a second carbon concentration in the second nitride crystal region. A <0001> direction of the first nitride crystal region is one of a first orientation from the second nitride crystal region toward the first nitride crystal region or a second orientation from the first nitride crystal region toward the second nitride crystal region. A <0001> direction of the second nitride crystal region is the other of the first orientation or the second orientation.

According to one embodiment, a method for manufacturing a nitride crystal is disclosed. The method can include processing a first nitride crystal layer in an atmosphere including oxygen. The method can include, after the processing, forming a third nitride crystal layer on the first nitride crystal layer at a temperature of 450° C. or less with a Group V/Group III ratio of 20000 or more. In addition, the method can include forming a second nitride crystal layer on the third nitride crystal layer.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously in an antecedent drawing are marked with like reference numerals, and a detailed description is omitted as appropriate.

First Embodiment

FIG. 1 is a schematic cross-sectional view illustrating a nitride crystal according to a first embodiment.

As shown in FIG. 1, the nitride crystal 110 according to the embodiment includes a first nitride crystal region 10, a second nitride crystal region 20, and a third nitride crystal region 30.

The third nitride crystal region 30 is provided between the first nitride crystal region 10 and the second nitride crystal region 20. The third nitride crystal region 30 includes Al. For example, the third nitride crystal region 30 includes AlN or AlGaN.

For example, the direction from the first nitride crystal region 10 toward the second nitride crystal region 20 is taken as a Z-axis direction. One direction perpendicular to the Z-axis direction is taken as an X-axis direction. A direction perpendicular to the Z-axis direction and the X-axis direction is taken as a Y-axis direction.

In the example, the nitride crystal 110 includes a substrate 50s and a nitride member 55. The first nitride crystal region 10 is between the substrate 50s and the second nitride crystal region 20. The first nitride crystal region 10 is between the substrate 50s and the third nitride crystal region 30. The nitride member 55 is provided between the substrate 50s and the first nitride crystal region 10. In one example, the nitride member 55 includes, for example, Al and N. The nitride member 55 may include, for example, Ga and N. The nitride member 55 is, for example, a low temperature-growth nitride semiconductor.

The concentration of oxygen (a third oxygen concentration) in the third nitride crystal region 30 is greater than the concentration of oxygen (a first oxygen concentration) in the first nitride crystal region 10 and greater than the concentration of oxygen (a second oxygen concentration) in the second nitride crystal region 20. The concentration of carbon (a third carbon concentration) in the third nitride crystal region 30 is greater than the concentration of carbon (a first carbon concentration) in the first nitride crystal region 10 and greater than the concentration of carbon (a second carbon concentration) in the second nitride crystal region 20.

The <0001> direction of the first nitride crystal region 10 is one of a first orientation from the second nitride crystal region 20 toward the first nitride crystal region 10 or a second orientation from the first nitride crystal region 10 toward the second nitride crystal region 20. The <0001> direction of the second nitride crystal region 20 is the other of the first orientation or the second orientation recited above.

In the example of FIG. 1, the <0001> direction of the first nitride crystal region 10 is the first orientation (e.g., the −Z direction), and the <0001> direction of the second nitride crystal region 20 is the second orientation (e.g., the +Z direction).

Figure 2:
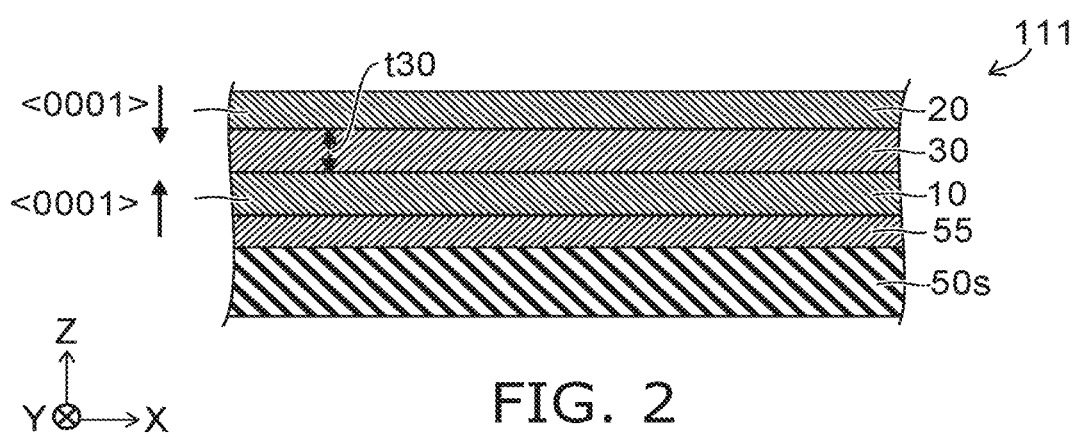
FIG. 2 is a schematic cross-sectional view illustrating a nitride crystal according to the first embodiment.

FIG. 2 is a schematic cross-sectional view illustrating a nitride crystal according to the first embodiment.

As shown in FIG. 2, the nitride crystal 111 according to the embodiment also includes the first nitride crystal region 10, the second nitride crystal region 20, and the third nitride crystal region 30. In the nitride crystal 111, the <0001> direction of the first nitride crystal region 10 is the second orientation (e.g., the +Z direction), and the <0001> direction of the second nitride crystal region 20 is the first orientation (e.g., the −Z direction).

When the <0001> direction of the first nitride crystal region 10 is the first orientation (e.g., the −Z direction) recited above, the polarity of the first nitride crystal region 10 is Group V-polar (e.g., nitrogen-polar). When the <0001> direction of the second nitride crystal region 20 is the second orientation (e.g., the +Z direction) recited above, the polarity of the second nitride crystal region 20 is Group III-polar (e.g., Al-polar or Ga-polar).

When the <0001> direction of the first nitride crystal region 10 is the second orientation (e.g., the +Z direction) recited above, the polarity of the first nitride crystal region 10 is Group III-polar (e.g., Al-polar or Ga-polar). When the <0001> direction of the second nitride crystal region 20 is the first orientation (e.g., the −Z direction) recited above, the polarity of the second nitride crystal is Group V-polar (e.g., nitrogen-polar).

Thus, in the nitride crystal (the nitride crystal 110 or the nitride crystal 111) according to the embodiment, the <0001> direction of the first nitride crystal region 10 is one of the first orientation recited above or the second orientation recited above. The <0001> direction of the second nitride crystal region 20 is the other of the first orientation recited above or the second orientation recited above.

In the nitride crystal (the nitride crystal 110 or the nitride crystal 111) according to the embodiment, the polarity of the first nitride crystal region 10 is the reverse of the polarity of the second nitride crystal region 20.

When the <0001> direction of the first nitride crystal region 10 is the first orientation (e.g., the −Z direction) recited above, the surface of the first nitride crystal region 10 on the third nitride crystal region 30 side is a Group V surface (e.g., a nitrogen surface). When the <0001> direction of the second nitride crystal region 20 is the second orientation (e.g., the +Z direction) recited above, the surface of the second nitride crystal region 20 on the side opposite to the third nitride crystal region 30 is a Group III surface (e.g., an Al surface or a Ga surface).

When the <0001> direction of the first nitride crystal region 10 is the second orientation (e.g., the +Z direction) recited above, the surface of the first nitride crystal region 10 on the third nitride crystal region 30 side is a Group III surface (e.g., an Al surface or a Ga surface). When the <0001> direction of the second nitride crystal region 20 is the first orientation (e.g., the −Z direction) recited above, the surface of the second nitride crystal region 20 on the side opposite to the third nitride crystal region 30 is a Group V surface (e.g., a nitrogen surface).

When the surface of the first nitride crystal region 10 on the third nitride crystal region 30 side is a Group V surface (e.g., a nitrogen surface), the polarity of the first nitride crystal region 10 is Group V-polar (e.g., nitrogen-polar). When the surface of the second nitride crystal region 20 on the side opposite to the third nitride crystal region 30 is a Group III surface (e.g., an Al surface or a Ga surface), the polarity of the second nitride crystal region 20 is Group III-polar (e.g., Al-polar or Ga-polar). A "Group V surface" (e.g., a nitrogen surface) corresponds to a "Group V-polar surface" (e.g., a nitrogen-polar surface). A "Group III surface" (e.g., an Al surface or a Ga surface) corresponds to a "Group III-polar surface" (e.g., an Al-polar surface or a Ga-polar surface).

When the surface of the first nitride crystal region 10 on the third nitride crystal region 30 side is a Group III surface (e.g., an Al surface or a Ga surface), the polarity of the first nitride crystal region 10 is Group III-polar (e.g., Al-polar or Ga-polar). When the surface of the second nitride crystal region 20 on the side opposite to the third nitride crystal region 30 is a Group V surface (e.g., a nitrogen surface), the polarity of the second nitride crystal region 20 is Group V-polar (e.g., nitrogen-polar).

It was found that in the nitride crystal according to the embodiment, the crystal orientation of the second nitride crystal region 20 can be set to the reverse of the crystal orientation of the first nitride crystal region 10 by providing a third nitride crystal region 30 such as that described above. It was found that the polarity of the crystal of the second nitride crystal region 20 can be set to the reverse of the polarity of the crystal of the first nitride crystal region 10 by providing a third nitride crystal region 30 such as that described above.

For example, the nitride crystal according to the embodiment is obtained by processing a layer used to form the first nitride crystal region 10 in an atmosphere including oxygen, subsequently forming a layer used to form the third nitride crystal region 30 at a relatively low temperature on the layer used to form the first nitride crystal region 10, and forming a layer used to form the second nitride crystal region 20 on the layer used to form the third nitride crystal region 30. An example of analysis results of a sample of the nitride crystal 110 made by such a method will now be described. An example of a method for manufacturing the nitride crystal according to the embodiment is described below.

Figure 3:
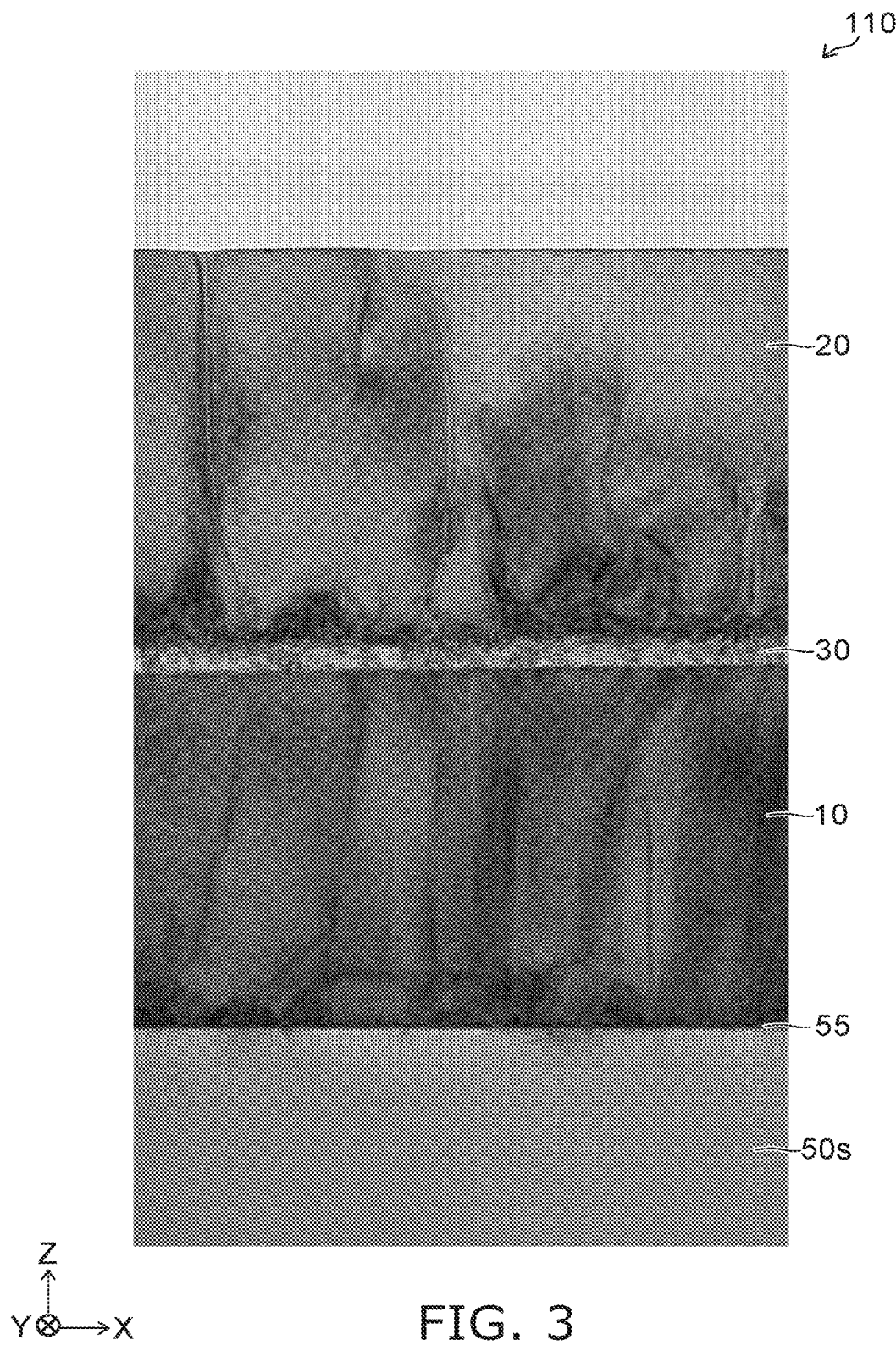
FIG. 3 is an electron microscope image illustrating the nitride crystal according to the first embodiment.

FIG. 3 is an electron microscope image illustrating the nitride crystal according to the first embodiment.

FIG. 3 is an example of a transmission electron microscope image of a sample of the nitride crystal 110 according to the embodiment. In this sample, the first nitride crystal region 10 and the second nitride crystal region 20 are GaN, and the third nitride crystal region 30 is AlN. As shown in FIG. 3, the third nitride crystal region 30 is between the first nitride crystal region 10 and the second nitride crystal region 20.

Figure 4A:
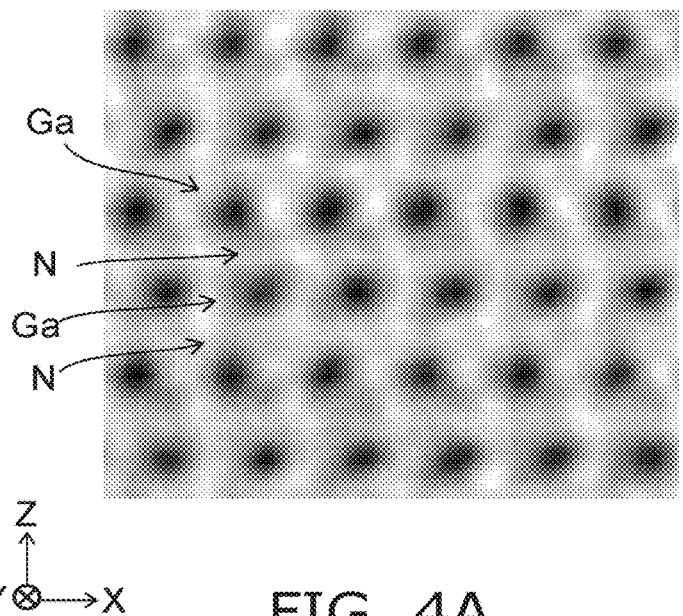
FIGS. 4A to 4D are schematic views illustrating the nitride crystal according to the first embodiment.
Figure 4B:
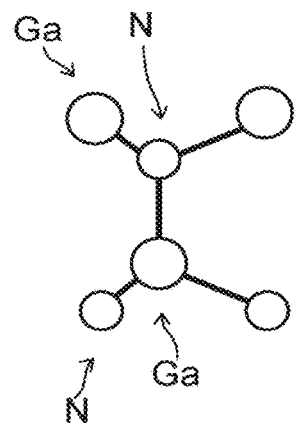
Figure 4C:
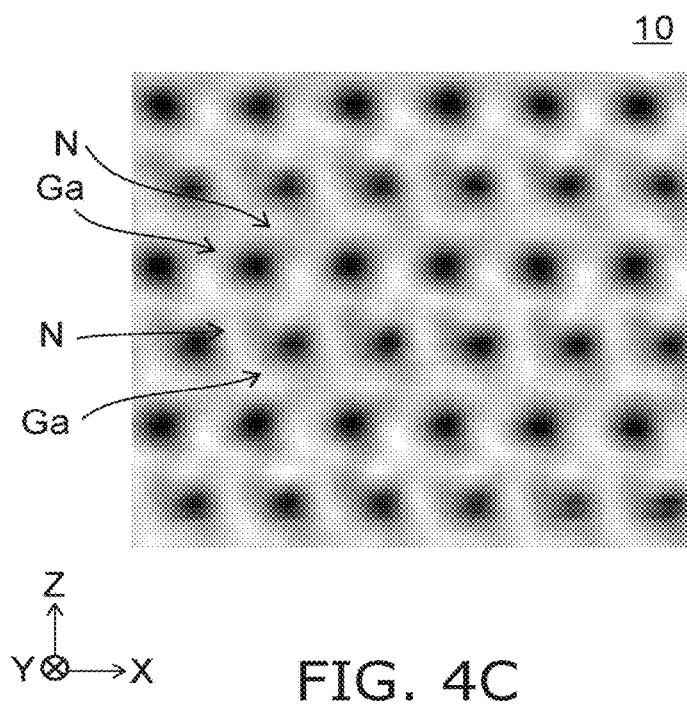
Figure 4D:
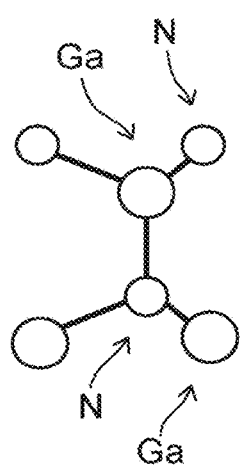

FIGS. 4A to 4D are schematic views illustrating the nitride crystal according to the first embodiment. FIGS. 4A and 4C are angle-controlled annular bright field-scanning transmission electron microscopy (ABF-STEM) images of the sample of the nitride crystal 110 according to the embodiment. FIG. 4A corresponds to the second nitride crystal region 20. FIG. 4C corresponds to the first nitride crystal region 10. FIG. 4B schematically shows the order of the atoms of the second nitride crystal region 20. FIG. 4D schematically shows the order of the atoms of the first nitride crystal region 10.

As shown in FIGS. 4A to 4D, the crystal orientation of the second nitride crystal region 20 is the reverse of the crystal orientation of the first nitride crystal region 10.

The crystal orientation of the first nitride crystal region 10 and the crystal orientation of the second nitride crystal region 20 of the nitride crystal 111 according to the embodiment are respectively the reverse of those of the nitride crystal 110.

Figure 5A:
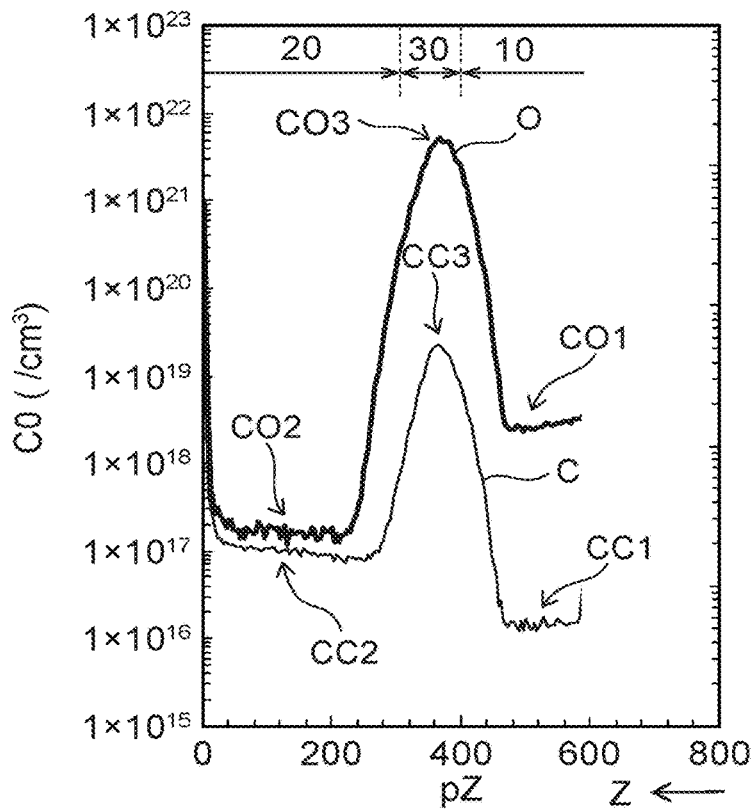
FIGS. 5A-5C are graphs illustrating the nitride crystal according to the first embodiment.
Figure 5B:
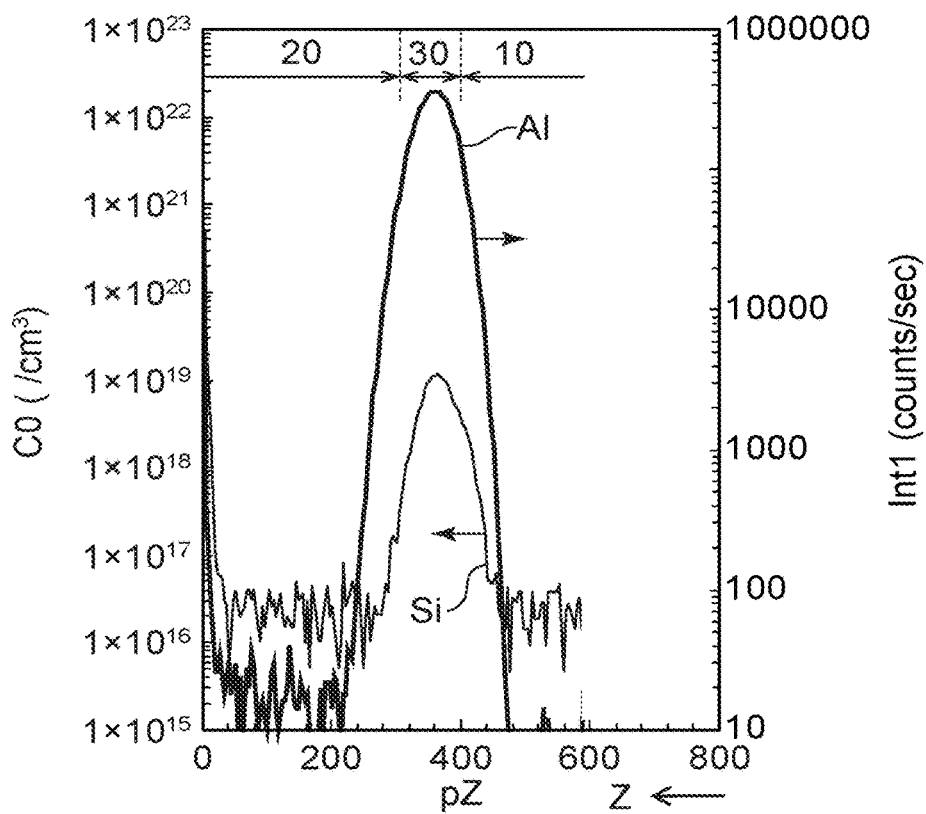
Figure 5C:
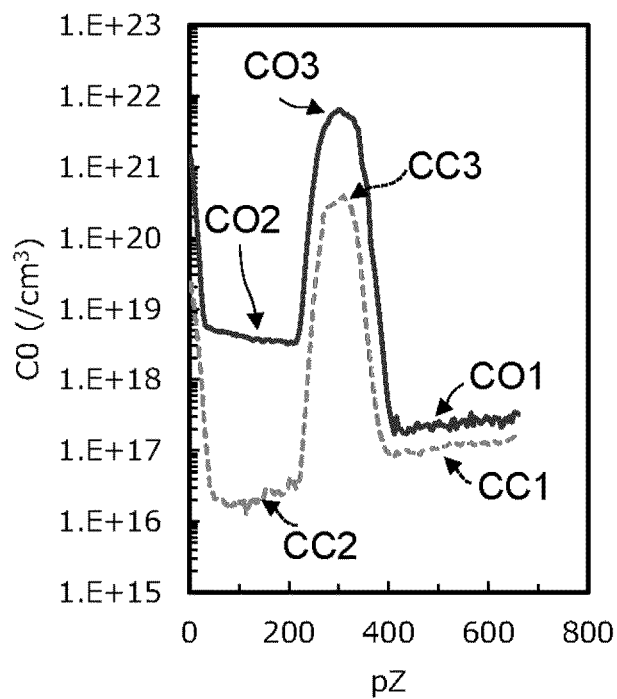

FIGS. 5A-5C are graphs illustrating the nitride crystal according to the first embodiment.

FIGS. 5A and 5B illustrate SIMS (Secondary Ion Mass Spectrometry) results of the sample of the nitride crystal 110 according to the embodiment. In these figures, the horizontal axis is a position pZ in the Z-axis direction. The vertical axis of FIG. 5A is the concentration C0 of oxygen (O) or the concentration C0 of carbon (C). The vertical axis on the left side of FIG. 5B is the concentration C0 of silicon (Si). The vertical axis on the right side of FIG. 5B is an intensity Int1 of the detection of aluminum (Al).

As shown in FIG. 5A, the concentration C0 of oxygen (a third oxygen concentration CO3) in the third nitride crystal region 30 is greater than the concentration C0 of oxygen (a first oxygen concentration CO1) in the first nitride crystal region 10. The third oxygen concentration CO3 is greater than the concentration C0 of oxygen (a second oxygen concentration CO2) in the second nitride crystal region 20.

As shown in FIG. 5A, the concentration C0 of carbon (a third carbon concentration CC3) in the third nitride crystal region 30 is greater than the concentration C0 of carbon (a first carbon concentration CC1) in the first nitride crystal region 10. The third carbon concentration CC3 is greater than the concentration C0 of carbon (a second carbon concentration CC2) in the second nitride crystal region 20.

In the embodiment, for example, the first oxygen concentration CO1 is not more than $1/1000$ of the third oxygen concentration CO3. For example, the second oxygen concentration CO2 is not more than $1/1000$ of the third oxygen concentration CO3.

In the embodiment, for example, the first carbon concentration CC1 is not more than $1/100$ of the third carbon concentration CC3. For example, the second carbon concentration CC2 is not more than $1/100$ of the third carbon concentration CC3.

For example, the third oxygen concentration CO3 is $1\times10^{20}/cm^3$ or more. The third oxygen concentration CO3 may be $1\times10^{21}/cm^3$ or more. When the third oxygen concentration CO3 is $1\times10^{20}/cm^3$ or more, the crystal orientation of the second nitride crystal region 20 easily becomes the reverse of the crystal orientation of the first nitride crystal region 10. It is more favorable for the third oxygen concentration CO3 to be $1\times10^{21}/cm^3$ or more. When the third oxygen concentration CO3 is $1\times10^{21}/cm^3$ or more, for example, the uniformity of the crystal orientation of the second nitride crystal region 20 is easily increased.

For example, it is favorable for the third oxygen concentration CO3 to be $1\times10^{23}/cm^3$ or less. When the third oxygen concentration CO3 is greater than $1\times10^{23}/cm^3$, there are cases where the uniformity of the crystal orientation of the second nitride crystal region 20 decreases. When the third oxygen concentration CO3 is greater than $1\times10^{23}/cm^3$, for example, there are cases where the quality of the crystal (e.g., the crystallinity) of the second nitride crystal region 20 decreases.

For example, the third carbon concentration CC3 is $5\times10^{18}/cm^3$ or more. The third carbon concentration CC3 may be $1\times10^{19}/cm^3$ or more. When the third carbon concentration CC3 is $5\times10^{18}/cm^3$ or more, the crystal orientation of the second nitride crystal region 20 easily becomes the reverse of the crystal orientation of the first nitride crystal region 10. It is more favorable for the third carbon concentration CC3 to be $1\times10^{19}/cm^3$ or more. When the third carbon concentration CC3 is $1\times10^{19}/cm^3$ or more, for example, the uniformity of the crystal orientation of the second nitride crystal region 20 is easily increased.

For example, it is favorable for the third carbon concentration CC3 to be $1\times10^{21}/cm^3$ or less. When the third carbon concentration CC3 is greater than $1\times10^{21}/cm^3$, there are cases where defects (e.g., dislocations) occur at the interface between the third nitride crystal region 30 and the second nitride crystal region 20. When the third carbon concentration CC3 is greater than $1\times10^{21}/cm^3$, there are cases where the quality of the crystal (e.g., the crystallinity) of the second nitride crystal region 20 decreases.

The crystal orientation can be inverted by providing the third nitride crystal region 30 in which the concentration C0 of oxygen and the concentration C0 of carbon are high. For example, bonds of Al—C—O—Al, O—Al—O, etc., are formed in the third nitride crystal region 30. It is considered that the orientation of the crystal is inverted thereby. For example, bonds of Ga—C—O—Ga, O—Ga—O, etc., are formed in the third nitride crystal region 30. It is considered that the orientation of the crystal is inverted thereby.

In the example as shown in FIG. 5A, the first oxygen concentration CO1 is greater than the second oxygen concentration CO2. The first carbon concentration CC1 is less than the second carbon concentration CC2. For such a concentration relationship, for example, the <0001> direction of the first nitride crystal region 10 easily becomes the first orientation (e.g., the −Z direction). For example, the <0001> direction of the second nitride crystal region 20 easily becomes the second orientation (e.g., the +Z direction).

In the embodiment, as shown in FIG. 5C, the first oxygen concentration CO1 may be less than the second oxygen concentration CO2, and the first carbon concentration CC1 may be greater than the second carbon concentration CC2. For such a concentration relationship, for example, the <0001> direction of the first nitride crystal region 10 easily becomes the second orientation (e.g., the +Z direction). For example, the <0001> direction of the second nitride crystal region 20 easily becomes the first orientation (e.g., the −Z direction).

In the example as shown in FIG. 5B, the Al composition ratios in the first and second nitride crystal regions 10 and 20 are less than the Al composition ratio in the third nitride crystal region 30. For example, the position where the concentration of Al becomes $1/3$ of the peak value may be taken as the boundary between the first nitride crystal region 10 and the third nitride crystal region 30 or the boundary between the second nitride crystal region 20 and the third nitride crystal region 30.

As shown in FIG. 5B, the third nitride crystal region 30 may include silicon (Si). For example, the first nitride crystal region 10 and the second nitride crystal region 20 do not include silicon. Or, the concentrations C0 of silicon in the first and second nitride crystal regions 10 and 20 are less than the concentration C0 of silicon in the third nitride crystal region 30. For example, in SIMS, the state of the concentration C0 of silicon being not more than the detection lower limit (e.g., not more than background level) practically may correspond to the "state of not including silicon".

Because the third nitride crystal region 30 includes silicon, the dislocation density in the layers (the second nitride crystal region 20, etc.) provided on the third nitride crystal region 30 can be low.

For example, it is favorable for the concentration C0 of silicon in the third nitride crystal region 30 to be not less than $1\times10^{18}/cm^3$ and not more than $1\times10^{20}/cm^3$. For example, the dislocation density can be effectively reduced by setting the concentration C0 of silicon in the third nitride crystal region 30 to be $1\times10^{18}/cm^3$ or more. An unnecessary conductivity does not occur easily when the concentration C0 of silicon in the third nitride crystal region 30 is $1\times10^{20}/cm^3$ or less.

It is favorable for the Mg concentration in the third nitride crystal region 30 to be less than $1\times10^{16}/cm^3$. For example, an unnecessary conductivity does not occur easily thereby.

For example, the front surface of the nitride semiconductor can have two types of polarities. One polarity is Group III-polar. The other polarity is Group V-polar (nitrogen-polar). The nitride semiconductor has different characteristics according to the polarity. It is considered that the features of the two types of polarities can be practically used in a stacked structure in which nitride semiconductors include the two types of polarities (Group III-polar and Group V-polar (nitrogen-polar)). For example, it is easier to provide higher functionality or higher performance of the nitride semiconductor.

For example, the In incorporation efficiency for the nitrogen polarity is greater than the In incorporation efficiency for the Group III polarity. By appropriately controlling the polarity, for example, a high-quality InGaN layer with a high In-composition-ratio can be formed.

In the embodiment, the polarity can be changed by providing a third nitride crystal region 30 such as that described above. According to the embodiment, a nitride crystal can be provided in which the characteristics can be improved.

In the embodiment, the third nitride crystal region 30 includes, for example, $Al_{x3}Ga_{1-x3}N$ ($0<x3\leq1$). The third nitride crystal region 30 may include, for example, AlN.

In the embodiment, the first nitride crystal region 10 includes $Al_{x1}Ga_{1-x1}N$ ($0\leq x1\leq1$). The second nitride crystal region 20 includes $Al_{x2}Ga_{1-x2}N$ ($0\leq x2\leq1$).

In one example, for example, the third nitride crystal region 30 may include AlN, and the first nitride crystal region 10 and the second nitride crystal region 20 may include AlN. In one example, for example, the third nitride crystal region 30 may include AlN, and the first nitride crystal region 10 and the second nitride crystal region 20 may include AlGaN. In one example, for example, the third nitride crystal region 30 may include AlN, and the first nitride crystal region 10 and the second nitride crystal region 20 may include GaN.

For example, the third nitride crystal region 30 includes $Al_{x3}Ga_{1-x3}N$ ($0.9\leq x3\leq1$). In such a case, the first nitride crystal region 10 includes, for example, $Al_{x1}Ga_{1-x1}N$ ($0\leq x1<0.9$). In such a case, the second nitride crystal region 20 includes, for example, $Al_{x2}Ga_{1-x2}N$ ($0\leq x2<0.9$).

As shown in FIG. 1 or FIG. 2, the third nitride crystal region 30 has a thickness t30. The thickness t30 is, for example, the length along the Z-axis direction. The thickness t30 is, for example, the length along the <0001> direction.

In the embodiment, it is favorable for the thickness t30 to be, for example, 6 nm or more. When the thickness t30 is 6 nm or more, for example, the crystal orientation of the second nitride crystal region 20 easily becomes the reverse of the crystal orientation of the first nitride crystal region 10. The thickness t30 may be 10 nm or more. It is more favorable for the thickness t30 to be 10 nm or more. For example, the uniformity of the crystal orientation of the second nitride crystal region 20 is easily increased thereby.

It is favorable for the thickness t30 to be, for example, 70 nm or less. When the thickness t30 is much greater than 70 nm, for example, there are cases where a part of the orientation of the crystal in the third nitride crystal region 30 again inverts, and the crystal orientation of the second nitride crystal region 20 becomes the same as the crystal orientation of the first nitride crystal region 10. It is more favorable for the thickness t30 to be, for example, 50 nm or less. When the thickness t30 is greater than 50 nm, for example, there are cases where defects (e.g., dislocations) easily occur at the interface between the third nitride crystal region 30 and the second nitride crystal region 20. When the thickness t30 is greater than 50 nm, for example, there are cases where the quality of the crystal (e.g., the crystallinity) of the second nitride crystal region 20 easily decreases.

Figure 6:
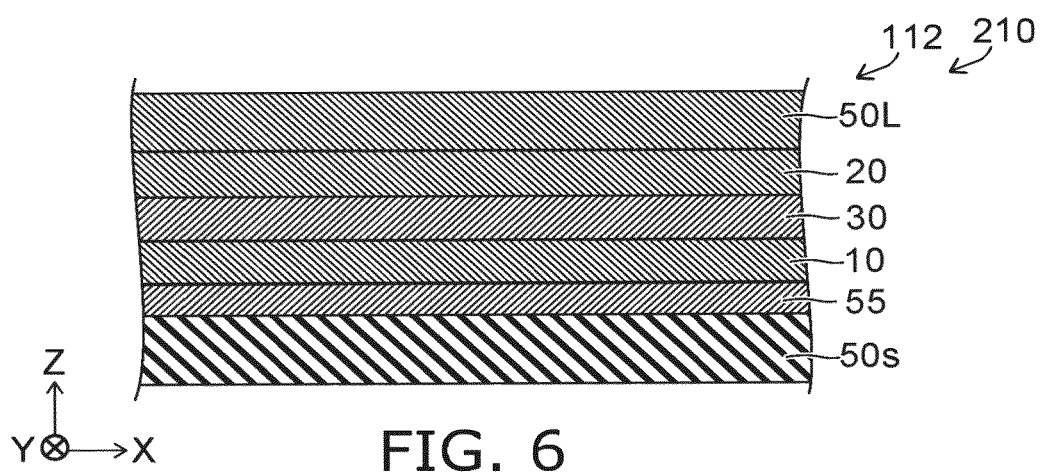
FIG. 6 is a schematic cross-sectional view illustrating a nitride crystal according to the first embodiment.

FIG. 6 is a schematic cross-sectional view illustrating a nitride crystal according to the first embodiment.

As shown in FIG. 6, the nitride crystal 112 according to the embodiment includes a nitride semiconductor layer 50L in addition to the first nitride crystal region 10, the second nitride crystal region 20, and the third nitride crystal region 30. For example, the nitride semiconductor layer 50L is provided on the second nitride crystal region 20. The nitride semiconductor layer 50L may be, for example, a functional layer. According to the nitride crystal 112 as well, a nitride crystal can be provided in which the characteristics can be improved.

The nitride crystal 112 may be included in a semiconductor device 210 according to the embodiment. According to the semiconductor device 210, a semiconductor device can be provided in which the characteristics can be improved.

An example of a method for manufacturing the nitride crystal 112 according to the embodiment will now be described.

FIGS. 7A to 7E are schematic cross-sectional views illustrating the method for manufacturing the nitride crystal according to the first embodiment.

Figure 7A:
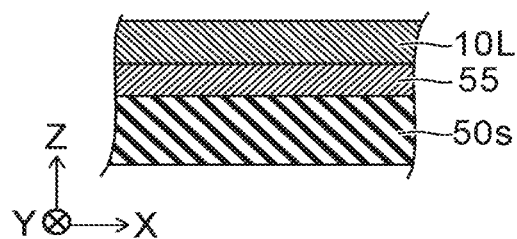
FIGS. 7A to 7E are schematic cross-sectional views illustrating the method for manufacturing the nitride crystal according to the first embodiment.

As shown in FIG. 7A, the nitride member 55 is provided on the substrate 50s. The nitride member 55 is, for example, a buffer layer. A first nitride crystal layer 10L that is used to form the first nitride crystal region 10 is provided on the nitride member 55. The first nitride crystal layer 10L may be formed by epitaxial growth. In one example, the first nitride crystal layer 10L is GaN. For example, the upper surface of the first nitride crystal layer 10L (the surface on the side opposite to the substrate 50s) is a Group V surface (e.g., a nitrogen surface). For example, the upper surface of the first nitride crystal layer 10L is caused to be a Group V surface (e.g., a nitrogen surface) by nitriding the front surface of the substrate 50s. For example, the nitride member 55 is formed on the substrate 50s by processing the substrate 50s in an atmosphere including a Group V source gas and by subsequently performing growth using a Group V source gas and a Group III source gas. The Group V source gas includes, for example, ammonia. The Group III source gas includes, for example, TMGa (trimethylgallium).

For example, the upper surface of the first nitride crystal layer 10L (the surface on the side opposite to the substrate 50s) becomes a Group III surface because the atoms of the front surface of the substrate 50s are Group III atoms. For example, the nitride member 55 is formed by processing the substrate 50s in an atmosphere including a Group III source gas and by subsequently performing growth using a Group V source gas and a Group III source gas. A case where the upper surface of the first nitride crystal layer 10L is a Group V surface (e.g., a nitrogen surface) will now be described.

Figure 7B:
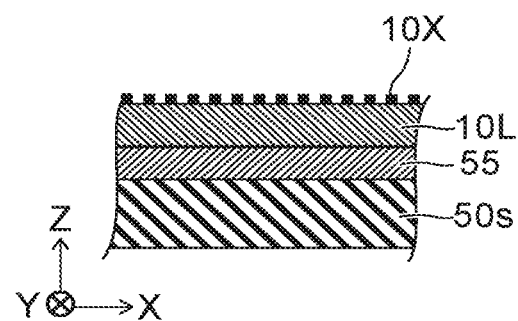

The first nitride crystal layer 10L illustrated in FIG. 7A is processed in an atmosphere including oxygen. Thereby, for example, as shown in FIG. 7B, oxygen 10X adsorbs to the front surface (the upper surface) of the first nitride crystal layer 10L. The processing in the atmosphere including oxygen includes, for example, processing in an ozone atmosphere. The processing in the atmosphere including oxygen may include, for example, placing a structure body including the first nitride crystal layer 10L in air. The processing in the atmosphere including oxygen may include, for example, heat treatment in an atmosphere including oxygen. In such a case, the temperature of the substrate 50s is, for example, not less than 200° C. and not more than 400° C.

Figure 7C:
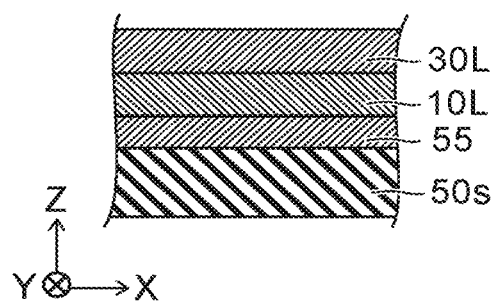

As shown in FIG. 7C, a third nitride crystal layer 30L is formed on the first nitride crystal layer 10L after the processing described above. In one example, the third nitride crystal layer 30L is AlN. For example, the third nitride crystal layer 30L is formed using a Group V source gas and a Group III source gas. The Group V source gas includes, for example, ammonia. The Group III source gas includes, for example, TMAl (trimethylaluminum).

The temperature is 450° C. or less in the formation of the third nitride crystal layer 30L. For example, the temperature of the substrate 50s is set to be not less than 350° C. and not more than 450° C. By forming the third nitride crystal layer 30L at such a low temperature, carbon is easily incorporated into the third nitride crystal layer 30L.

The Group V/Group III ratio in the formation of the third nitride crystal layer 30L is, for example, 20000 or more. For example, the Group V/Group III ratio is not less than 20000 and not more than 100000. By such a Group V/Group III ratio, oxygen is easily incorporated into the third nitride crystal layer 30L. The polarity of the crystal changes (e.g., inverts) in the third nitride crystal layer 30L.

Figure 7D:
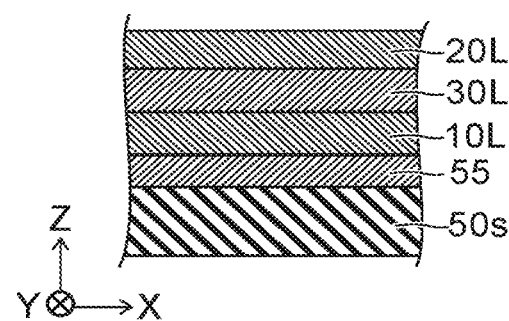

As shown in FIG. 7D, a second nitride crystal layer 20L is formed on the third nitride crystal layer 30L. In one example, the second nitride crystal layer 20L is GaN. The crystal orientation of the second nitride crystal layer 20L is inverted with respect to the crystal orientation of the first nitride crystal layer 10L. For example, the upper surface (e.g., the front surface) of the second nitride crystal layer 20L is a Group III surface (e.g., a Ga surface).

Figure 7E:
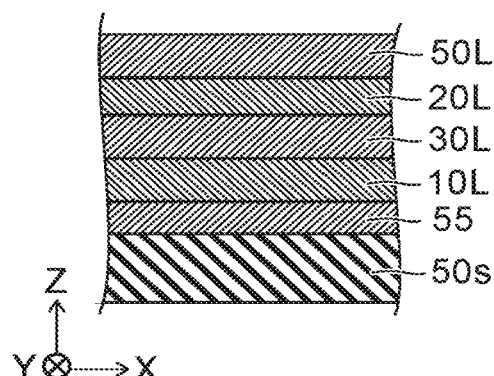

As shown in FIG. 7E, the nitride semiconductor layer 50L also may be formed on the second nitride crystal layer 20L. The nitride semiconductor layer 50L may be, for example, a functional layer. The polarity of the nitride semiconductor layer 50L is the same as the polarity of the second nitride crystal layer 20L.

At least a portion of the first nitride crystal layer 10L is used to form the first nitride crystal region 10. At least a portion of the third nitride crystal layer 30L is used to form the third nitride crystal region 30. At least a portion of the second nitride crystal layer 20L is used to form the second nitride crystal region 20.

The first nitride crystal layer 10L described above may be formed as follows. For example, the substrate 50s (e.g., a sapphire substrate) is introduced to the processing chamber of a MOCVD apparatus. The temperature of the substrate 50s is increased. Heat treatment is performed in a hydrogen atmosphere in a state in which the temperature of the substrate 50s is 1100° C. For example, thermal cleaning is performed. Subsequently, ammonia is introduced to the processing chamber, and the front surface of the substrate 50s is nitrided in a state in which the temperature of the substrate 50s is 1100° C.

Subsequently, the temperature of the substrate 50s is set to 470° C., and a GaN layer (the nitride member 55) is formed in a hydrogen atmosphere by supplying TMGa (trimethylgallium) and ammonia. The nitride member 55 is a buffer layer. The thickness of the nitride member 55 is, for example, about 7 nm.

Subsequently, the temperature of the substrate 50s is set to 1050° C., and a GaN layer (the first nitride crystal layer 10L) is formed in a hydrogen atmosphere by supplying TMGa and ammonia. The thickness of the first nitride crystal layer 10L is, for example, 300 nm.

Subsequently, the temperature of the substrate 50s is lowered to room temperature. Excimer light is irradiated on the structure body including the first nitride crystal layer 10L in an oxygen atmosphere. Thereby, oxygen is adsorbed to the front surface of the first nitride crystal layer 10L.

Subsequently, the temperature of the substrate 50s is increased to 400° C. in a nitrogen atmosphere. In this state, AlN (the third nitride crystal layer 30L) is formed by supplying TMAl and ammonia. At this time, the Group V/Group III ratio is, for example, 18000.

Subsequently, the temperature of the substrate 50s is set to 1100° C., and TMGa and ammonia are supplied in a hydrogen atmosphere. A GaN layer (the second nitride crystal layer 20L) is formed thereby. The thickness of the second nitride crystal layer 20L is, for example, about 300 nm.

Figure 8:
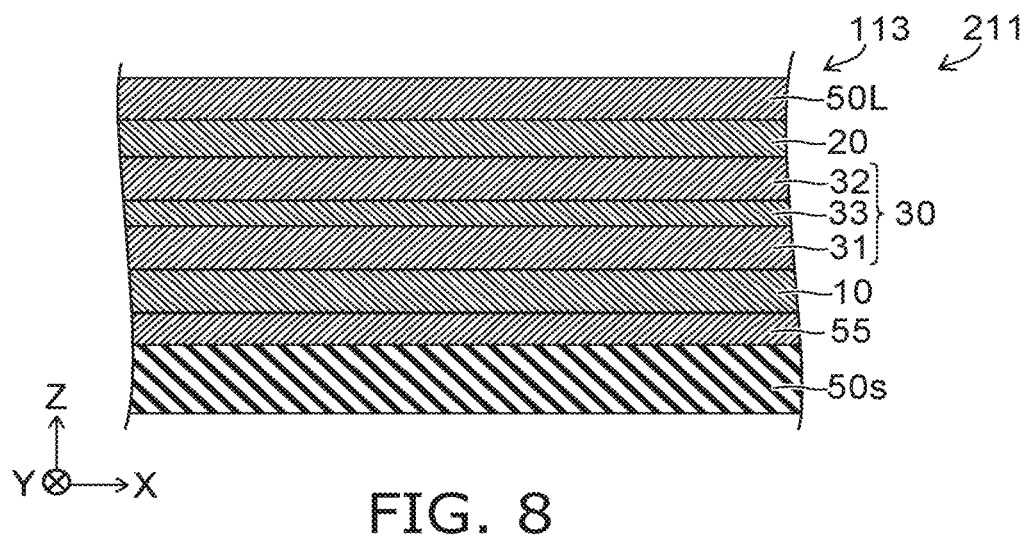
FIG. 8 is a schematic cross-sectional view illustrating a nitride crystal according to the first embodiment.

FIG. 8 is a schematic cross-sectional view illustrating a nitride crystal according to the first embodiment.

In the nitride crystal 113 according to the embodiment as shown in FIG. 8, the third nitride crystal region 30 includes multiple regions. Otherwise, the nitride crystal 113 may be similar to the nitride crystal 112.

As shown in FIG. 8, the third nitride crystal region 30 includes a first partial region 31, a second partial region 32, and a third partial region 33. The first partial region 31 includes $Al_{y1}Ga_{1-y1}N$ ($0<y1\leq1$). The second partial region 32 is provided between the first partial region 31 and the second nitride crystal region 20. The second partial region 32 includes $Al_{y2}Ga_{1-y2}N$ ($0<y2\leq1$). The third partial region 33 is provided between the first partial region 31 and the second partial region 32. The third partial region 33 includes $Al_{y3}Ga_{1-y3}N$ ($0\leq y3<1$, $y3<y1$, and $y3<y2$).

In one example, for example, the first partial region 31 and the second partial region 32 include AlN, and the third partial region 33 includes GaN. In such a third nitride crystal region 30 as well, the polarity can be changed (e.g., inverted). The dislocation density can be reduced by the third nitride crystal region 30 that includes regions having different composition ratios of Al.

In one example, the first partial region 31 and the second partial region 32 include AlN, and the third partial region 33 includes AlGaN. In such a third nitride crystal region 30 as well, the polarity can be changed (e.g., inverted). For example, the dislocation density can be reduced by the third nitride crystal region 30 including regions having different composition ratios of Al.

For example, in the nitride crystal 112 described above (referring to FIG. 6), the Al composition ratio in the third nitride crystal region 30 is substantially constant. The threading dislocation density in the nitride crystal 112 is about $1.2 \times 10^8/\text{cm}^2$.

On the other hand, in the nitride crystal 113 described above, the third nitride crystal region 30 includes multiple regions having mutually-different composition ratios of Al. The threading dislocation density in the nitride crystal 113 is about $6.0 \times 10^7/\text{cm}^2$.

The nitride crystal 113 may be included in a semiconductor device 211 according to the embodiment. According to the semiconductor device 211, a semiconductor device can be provided in which the characteristics can be improved.

In another example according to the embodiment, the first nitride crystal region 10 is AlN, the third nitride crystal region 30 is AlN, and the second nitride crystal region 20 is AlN. The upper surface of the first nitride crystal region 10 (the surface on the third nitride crystal region 30 side) is a nitrogen surface. The upper surface of the second nitride crystal region 20 (the surface on the third nitride crystal region 30 side) is an Al surface. In such a case, the polarity of the first nitride crystal region 10 is nitrogen-polar. The polarity of the second nitride crystal region 20 is Group III-polar (Al-polar).

In another example according to the embodiment, the first nitride crystal region 10 is GaN, the third nitride crystal region 30 is AlN, and the second nitride crystal region 20 is GaN. The upper surface of the first nitride crystal region 10 (the surface on the third nitride crystal region 30 side) is a Ga surface. The upper surface of the second nitride crystal region 20 is a nitrogen surface. In such a case, the polarity of the first nitride crystal region 10 is Group III-polar (Ga-polar). The polarity of the second nitride crystal region 20 is nitrogen-polar.

In another example according to the embodiment, the first nitride crystal region 10 is AlN, the third nitride crystal region 30 is AlN, and the second nitride crystal region 20 is AlN. The upper surface of the first nitride crystal region 10 (the surface on the third nitride crystal region 30 side) is an Al surface. The upper surface of the second nitride crystal region 20 (the surface on the third nitride crystal region 30 side) is a nitrogen surface. In such a case, the polarity of the first nitride crystal region 10 is Group III-polar (Al-polar). The polarity of the second nitride crystal region 20 is nitrogen-polar.

In another example according to the embodiment, the first nitride crystal region 10 is GaN, the third nitride crystal region 30 is $Al_{0.2}Ga_{0.8}N$, and the second nitride crystal region 20 is GaN. The upper surface of the first nitride crystal region 10 (the surface on the third nitride crystal region 30 side) is a nitrogen surface. The upper surface of the second nitride crystal region 20 (the surface on the side opposite to the third nitride crystal region 30) is a Ga surface. In such a case, the polarity of the first nitride crystal region 10 is nitrogen-polar. The polarity of the second nitride crystal region 20 is Group III-polar (Ga-polar).

In another example according to the embodiment, the first nitride crystal region 10 is GaN, the third nitride crystal region 30 is $Al_{0.2}Ga_{0.8}N$, and the second nitride crystal region 20 is GaN. The upper surface of the first nitride crystal region 10 (the surface on the third nitride crystal region 30 side) is a Ga surface. The upper surface of the second nitride crystal region 20 (the surface on the side opposite to the third nitride crystal region 30) is a nitrogen surface. In such a case, the polarity of the first nitride crystal region 10 is Group III-polar (Ga-polar). The polarity of the second nitride crystal region 20 is nitrogen-polar.

Second Embodiment

Figure 9:
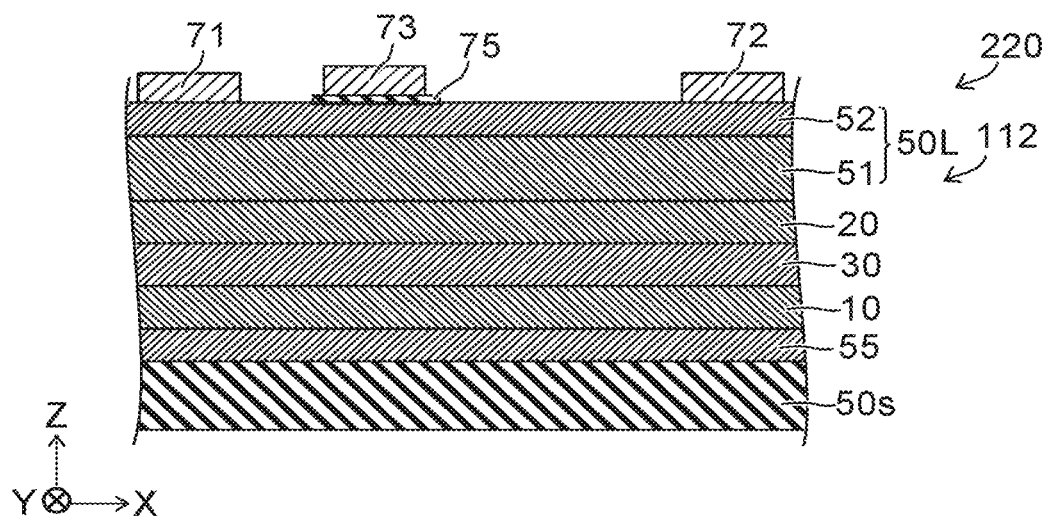
FIG. 9 is a schematic cross-sectional view illustrating a semiconductor device according to a second embodiment.

FIG. 9 is a schematic cross-sectional view illustrating a semiconductor device according to a second embodiment.

As shown in FIG. 9, the semiconductor device 220 according to the embodiment includes the nitride semiconductor layer 50L and the nitride crystal according to the first embodiment. The nitride semiconductor layer 50L is provided on the nitride crystal. In the example, the nitride crystal 112 is used as the nitride crystal described above.

In the example, the nitride semiconductor layer 50L includes a first region 51 and a second region 52. The first region 51 is between the nitride crystal 112 and the second region 52. The first region 51 includes $Al_{z1}Ga_{1-z1}N$ ($0 \leq z1 < 1$). The second region 52 includes $Al_{z2}Ga_{1-z2}N$ ($z1 < z2 \leq 1$).

In the example, the semiconductor device 220 includes a first electrode 71, a second electrode 72, a third electrode 73, and an insulating member 75. In the example, the position in the X-axis direction of the third electrode 73 is between the position in the X-axis direction of the first electrode 71 and the position in the X-axis direction of the second electrode 72. The first electrode 71 is electrically connected to a portion of the nitride semiconductor layer 50L. The second electrode 72 is electrically connected to another portion of the nitride semiconductor layer 50L. The insulating member 75 is provided between the third electrode 73 and the nitride semiconductor layer 50L. A current that flows between the first electrode 71 and the second electrode 72 can be controlled by a potential of the third electrode 73. The semiconductor device 220 is, for example, a HEMT (High Electron Mobility Transistor).

The semiconductor device 220 includes the nitride crystal 112 that includes inverted polarities. In the semiconductor device 220, for example, the upper surface (the surface on the side opposite to the substrate 50s) of the region proximate to the substrate 50s is a nitrogen surface. For example, the <0001> direction of the region proximate to the substrate 50s is the −Z direction. For example, a low dislocation density is obtained thereby. The upper surface (the surface on the side opposite to the substrate 50s) of the region distant to the substrate 50s is, for example, a Group III surface (e.g., a Ga surface). For example, the <0001> direction of the region distant to the substrate 50s is the +Z direction. For example, high mobility is obtained thereby. For example, high reliability is easily obtained. According to the semiconductor device 220, a semiconductor device can be provided in which the characteristics can be improved.

Figure 10:
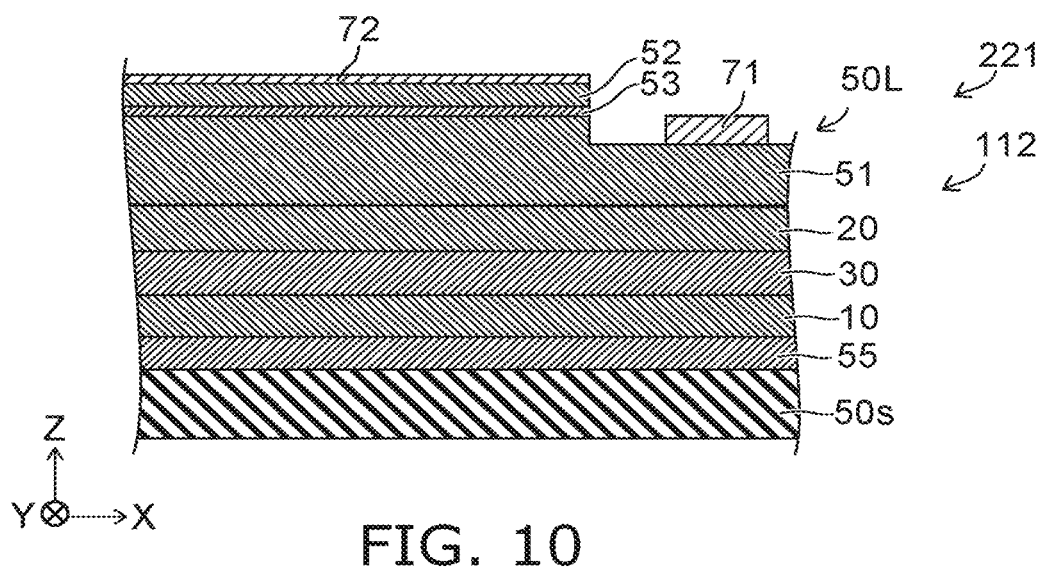
FIG. 10 is a schematic cross-sectional view illustrating a semiconductor device according to the second embodiment.

FIG. 10 is a schematic cross-sectional view illustrating a semiconductor device according to the second embodiment.

As shown in FIG. 10, the semiconductor device 221 according to the embodiment includes the nitride semiconductor layer 50L and the nitride crystal 112 according to the first embodiment. In the example, the nitride semiconductor layer 50L includes the first region 51, the second region 52, and a third region 53.

The first region 51 is between the nitride crystal 112 and the second region 52. The third region 53 is between the first region 51 and the second region 52. The first region 51 is of a first conductivity type (e.g., an n-type). The second region 52 is of a second conductivity type (e.g., a p-type).

The third region 53 includes at least one of a higher In concentration than the In concentration in the first region 51 or a lower concentration of Al than the Al concentration in the first region 51. The third region 53 includes at least one of a higher In concentration than the In concentration in the second region 52 or a lower concentration of Al than the Al concentration in the second region 52. The third region 53 includes, for example, a well layer. The third region 53 is, for example, a light-emitting region. The first electrode 71 is electrically connected to the first region 51. The second electrode 72 is electrically connected to the second region 52. The semiconductor device 221 is, for example, a light-emitting device.

The semiconductor device 221 includes the nitride crystal 112 that includes inverted polarities. In the semiconductor device 221, for example, the upper surface (the surface on the side opposite to the substrate 50s) of the region proximate to the substrate 50s is a nitrogen surface. For example, the <0001> direction of the region proximate to the substrate 50s is the −Z direction. In the semiconductor device 221, for example, a low dislocation density is obtained. The upper surface (the surface on the side opposite to the substrate 50s) of the region distant to the substrate 50s is, for example, a Group III surface (e.g., a Ga surface). For example, the <0001> direction of the region distant to the substrate 50s is the +Z direction. In the semiconductor device 221, for example, a high luminous efficiency is obtained.

Third Embodiment

Figure 11A:
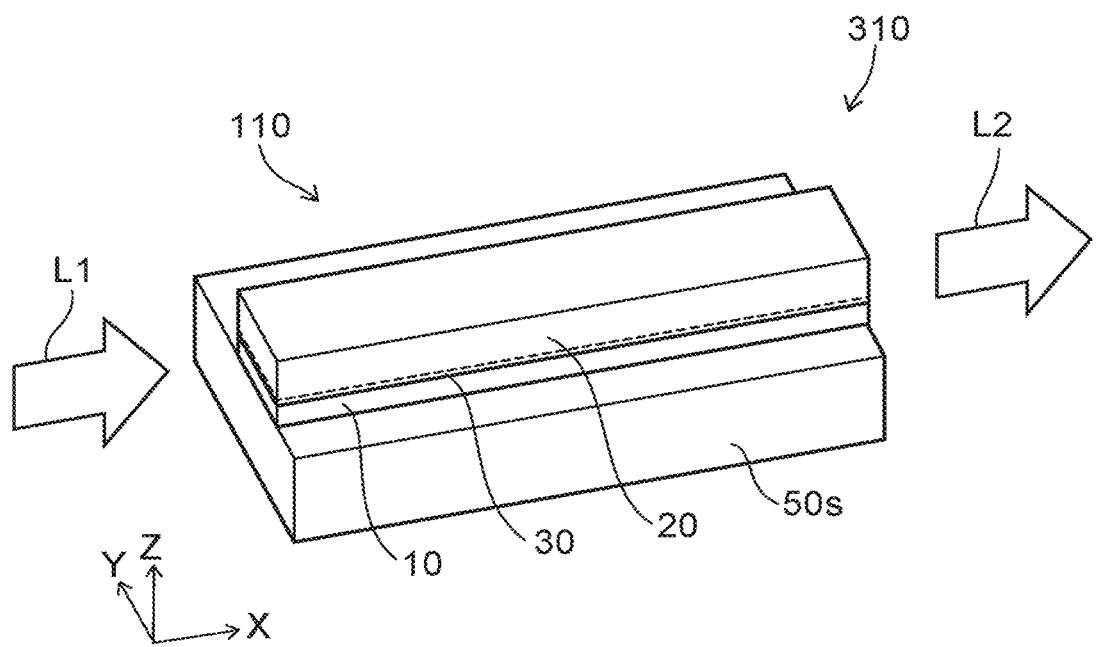
FIGS. 11A and 11B are schematic views illustrating an optical device according to a third embodiment.
Figure 11B:
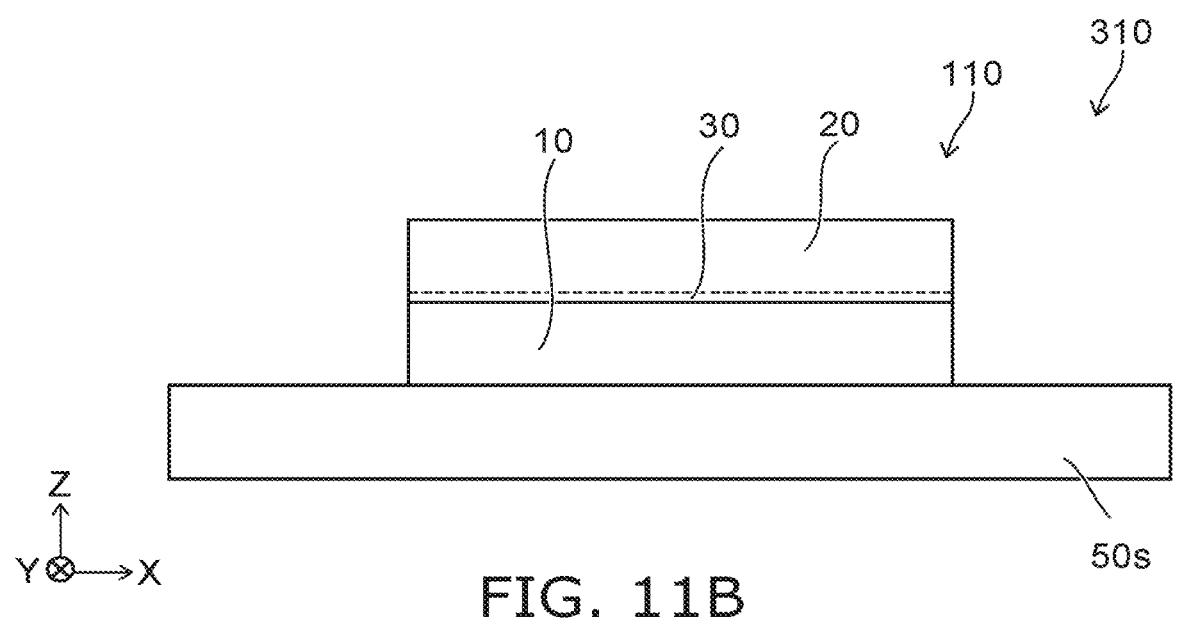

FIGS. 11A and 11B are schematic views illustrating an optical device according to a third embodiment.

FIG. 11A is a perspective view. FIG. 11B is a cross-sectional view.

As shown in FIGS. 11A and 11B, the optical device 310 according to the embodiment includes the nitride crystal (e.g., the nitride crystal 110) according to the first embodiment. For example, a first light L1 is incident on the side surface of the nitride crystal 110. A second light L2 is emitted from another side surface of the nitride crystal 110. In the nitride crystal 110, the polarity of the second nitride crystal region 20 is the reverse of the polarity of the first nitride crystal region 10. Thereby, the second light L2 is the second harmonic of the first light L1. The wavelength of the second light L2 is ½ of the wavelength of the first light L1. For example, the optical device 310 functions as a wavelength conversion device.

For example, the wavelength of the first light L1 is 810 nm. The wavelength of the second light L2 is 405 nm. In the optical device 310 according to the embodiment, a wavelength conversion device is obtained by a simple configuration. According to the embodiment, an optical device can be provided in which the characteristics can be improved.

Fourth Embodiment

Figure 12:
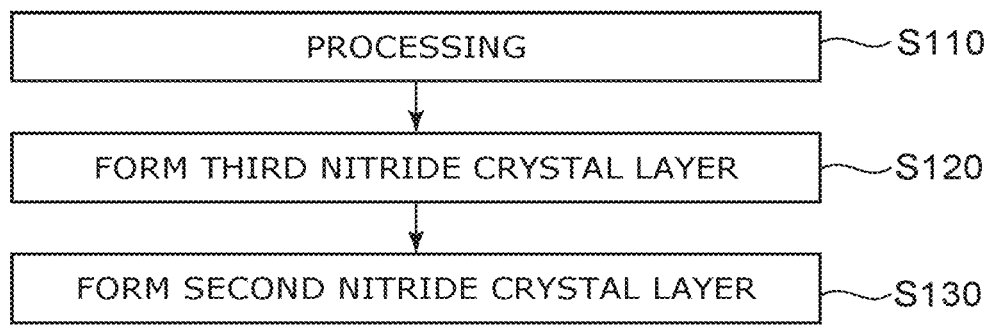
FIG. 12 is a flowchart illustrating a method for manufacturing a nitride crystal according to a fourth embodiment.

FIG. 12 is a flowchart illustrating a method for manufacturing a nitride crystal according to a fourth embodiment.

As shown in FIG. 12, the manufacturing method according to the embodiment includes processing the first nitride crystal layer 10L in an atmosphere including oxygen (step S110). After the processing, the manufacturing method includes forming the third nitride crystal layer 30L on the first nitride crystal layer 10L with a Group V/Group III ratio of 20000 or more at a temperature of 450° C. or less (step S120). The manufacturing method includes forming the second nitride crystal layer 20L on the third nitride crystal layer 30L (step S130). For example, the processing described with reference to FIGS. 7B to 7D is performed.

According to the embodiment, a method for manufacturing a nitride crystal can be provided in which the characteristics can be improved.

In the embodiment, for example, the third oxygen concentration CO3 in the third nitride crystal layer 30L is greater than the first oxygen concentration CO1 in the first nitride crystal layer 10L and greater than the second oxygen concentration CO2 in the second nitride crystal layer 20L. For example, the third carbon concentration CC3 in the third nitride crystal layer 30L is greater than the first carbon concentration CC1 in the first nitride crystal layer 10L and greater than the second carbon concentration CC2 in the second nitride crystal layer 20L.

In the embodiment, the substrate 50s may be, for example, a silicon substrate. The substrate 50s may be, for example, a sapphire substrate. The substrate 50s may be, for example, a SiC substrate. The substrate 50s may be, for example, a GaN substrate. The substrate 50s may be, for example, an AlN substrate.

In the embodiment, the nitride member 55 may include, for example, an AlN. The nitride member 55 may include, for example, a stacked body in which multiple AlGaN layers are stacked. The nitride member 55 may have, for example, a superlattice structure in which GaN and AlN are alternately stacked.

In the embodiments, "nitride semiconductor" includes all compositions of semiconductors of the chemical formula $B_xIn_yAl_zGa_{1-x-y-z}N$ ($0 \leq x \leq 1$, $0 \leq y \leq 1$, $0 \leq z \leq 1$, and $x+y+z \leq 1$) for which the composition ratios x, y, and z are changed within the ranges respectively. "Nitride semiconductor" further includes Group V elements other than N (nitrogen) in the chemical formula recited above, various elements added to control various properties such as the conductivity type and the like, and various elements included unintentionally.

According to the embodiments, a nitride crystal, an optical device, a semiconductor device, and a method for manufacturing a nitride crystal can be provided in which the characteristics can be improved.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as conductive portions, semiconductor regions, insulating portions, interconnects, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all nitride crystals, optical devices, semiconductor devices, and methods for manufacturing nitride crystals practicable by an appropriate design modification by one skilled in the art based on the nitride crystals, the optical devices, the semiconductor devices, and the methods for manufacturing nitride crystals described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A nitride crystal, comprising:
    a first nitride crystal region;
    a second nitride crystal region; and
    a third nitride crystal region provided between the first nitride crystal region and the second nitride crystal region, the third nitride crystal region including Al,
    a third oxygen concentration in the third nitride crystal region being greater than a first oxygen concentration in the first nitride crystal region and greater than a second oxygen concentration in the second nitride crystal region,
    a third carbon concentration in the third nitride crystal region being greater than a first carbon concentration in the first nitride crystal region and greater than a second carbon concentration in the second nitride crystal region,
    a <0001> direction of the first nitride crystal region being one of a first orientation from the second nitride crystal region toward the first nitride crystal region or a second orientation from the first nitride crystal region toward the second nitride crystal region,
    a <0001> direction of the second nitride crystal region being the other of the first orientation or the second orientation,
    the first oxygen concentration being less than the second oxygen concentration, and
    the first carbon concentration being more than the second carbon concentration.

2. The nitride crystal according to claim 1, wherein
    the first oxygen concentration is not more than 1/1000 of the third oxygen concentration,
    the second oxygen concentration is not more than 1/1000 of the third oxygen concentration,
    the first carbon concentration is not more than 1/100 of the third carbon concentration, and
    the second carbon concentration is not more than 1/100 of the third carbon concentration.

3. The nitride crystal according to claim 1, wherein
    the third oxygen concentration is $1\times10^{20}/cm^3$ or more, and
    the third carbon concentration is $5\times10^{18}/cm^3$ or more.

4. The nitride crystal according to claim 1, wherein
    the <0001> direction of the first nitride crystal region is the second orientation, and
    the <0001> direction of the second nitride crystal region is the first orientation.

5. The nitride crystal according to claim 1, wherein
    the third nitride crystal region includes silicon, and
    the first nitride crystal region and the second nitride crystal region do not include silicon, or concentrations of silicon in the first nitride crystal region and the second nitride crystal region are less than a concentration of silicon in the third nitride crystal region.

6. The nitride crystal according to claim 5, wherein
    the concentration of silicon in the third nitride crystal region is not less than $1\times10^{18}/cm^3$ and not more than $1\times10^{20}/cm^3$.

7. The nitride crystal according to claim 1, wherein
    a concentration of Mg in the third nitride crystal region is less than $1\times10^{16}/cm^3$.

8. The nitride crystal according to claim 1, wherein
    the third nitride crystal region includes $Al_{x3}Ga_{1-x3}N$ ($0 \leq x3 \leq 1$).

9. The nitride crystal according to claim 8, wherein
    the first nitride crystal region includes $Al_{x1}Ga_{1-x1}N$ ($0 \leq x1 \leq 1$), and
    the second nitride crystal region includes $Al_{x2}Ga_{1-x2}N$ ($0 \leq x2 \leq 1$).

10. The nitride crystal according to claim 1, wherein
    the third nitride crystal region includes $Al_{x3}Ga_{1-x3}N$ ($0.9 \leq x3 \leq 1$),
    the first nitride crystal region includes $Al_{x1}Ga_{1-x1}N$ ($0 \leq x1 < 0.9$), and
    the second nitride crystal region includes $Al_{x2}Ga_{1-x2}N$ ($0 \leq x2 < 0.9$).

11. The nitride crystal according to claim 1, wherein
    the third nitride crystal region includes:
        a first partial region including $Al_{y1}Ga_{1-y1}N$ ($0 < y1 \leq 1$);
        a second partial region provided between the first partial region and the second nitride crystal region, the second partial region including $Al_{y2}Ga_{1-y2}N$ ($0 < y2 \leq 1$); and
        a third partial region provided between the first partial region and the second partial region, the third partial region including $Al_{y3}Ga_{1-y3}N$ ($0 \leq y3 < 1$, $y3 < y1$, and $y3 < y2$).

12. The nitride crystal according to claim 1, further comprising:
    a substrate,
    the first nitride crystal region being between the substrate and the second nitride crystal region.

13. The nitride crystal according to claim 1, wherein
    a thickness of the third nitride crystal region is not less than 6 nm and not more than 70 nm.

14. An optical device, comprising:
    the nitride crystal according to claim 1.

15. A semiconductor device, comprising:
    the nitride crystal according to claim 1; and
    a nitride semiconductor layer.

16. The semiconductor device according to claim 15, wherein
    the nitride semiconductor layer includes a first region and a second region,
    the first region is between the nitride crystal and the second region,
    the first region includes $Al_{z1}Ga_{1-z1}N$ ($0 \leq z1 < 1$), and
    the second region includes $Al_{z2}Ga_{1-z2}N$ ($z1 < z2 \leq 1$).

17. The semiconductor device according to claim 15, wherein
    the nitride semiconductor layer includes a first region, a second region, and a third region,
    the first region is between the nitride crystal and the second region,
    the third region is between the first region and the second region,
    the first region is of a first conductivity type, the second region is of a second conductivity type, and
the third region includes at least one of a higher In concentration than an In concentration in the first region or a lower concentration of Al than a concentration of Al in the first region.

* * * * *